(12) United States Patent
Tomita

(10) Patent No.: US 12,278,274 B2
(45) Date of Patent: Apr. 15, 2025

(54) METHOD OF MANUFACTURING SILICON CARBIDE SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Hidemoto Tomita, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 241 days.

(21) Appl. No.: 18/052,424

(22) Filed: Nov. 3, 2022

(65) Prior Publication Data
US 2023/0154999 A1 May 18, 2023

(30) Foreign Application Priority Data
Nov. 12, 2021 (JP) .................. 2021-185006

(51) Int. Cl.
*H01L 29/66* (2006.01)
*H01L 21/04* (2006.01)

(52) U.S. Cl.
CPC .... *H01L 29/66068* (2013.01); *H01L 21/0465* (2013.01)

(58) Field of Classification Search
CPC . H01L 21/046; H01L 21/0465; H01L 21/047; H01L 21/266; H01L 29/0634;
(Continued)

(56) References Cited

U.S. PATENT DOCUMENTS

| 5,786,251 A | 7/1998 | Harris et al. |
| 2006/0284248 A1* | 12/2006 | Saito .................. H01L 29/7802 |
| | | 257/E29.066 |

(Continued)

FOREIGN PATENT DOCUMENTS

| JP | 2008-205086 A | 9/2008 |
| JP | 2009-188025 A | 8/2009 |

(Continued)

OTHER PUBLICATIONS

Masuda, Takeyoshi et.al. "0.63 mΩcm2/ 1170V 4H—SiC Super Junction V-Groove Trench MOSFET." Preprint submitted to 2018 IEEE International Electron Devices Meeting (IEDM), pp. 1-4.

*Primary Examiner* — Eric A. Ward
(74) *Attorney, Agent, or Firm* — Posz Law Group, PLC

(57) ABSTRACT

A method of manufacturing a silicon carbide semiconductor device includes forming a constituent layer and forming a super junction structure. The formation of the super junction structure includes forming a film-forming mask on the constituent layer, forming an opening portion at the film-forming mask, forming a mask-forming trench at the constituent layer and adopting a portion of the constituent layer surrounding the mask-forming trench as a silicon carbide mask through etching by adopting the film-forming mask, forming a second-conductivity-type column region by ion implantation of impurities at a bottom surface of the mask-forming trench by adopting an ion-implantation mask having the film-forming mask and the silicon carbide mask, and removing a portion of the constituent layer where the silicon carbide mask is formed.

3 Claims, 8 Drawing Sheets

(58) Field of Classification Search
CPC .......... H01L 29/1608; H01L 29/66068; H01L 29/7813
See application file for complete search history.

(56) References Cited

U.S. PATENT DOCUMENTS

| | | |
|---|---|---|
| 2010/0155840 A1 | 6/2010 | Tu |
| 2011/0227147 A1* | 9/2011 | Li ................... H01L 29/0634 257/329 |
| 2014/0015040 A1* | 1/2014 | Lin ................... H01L 29/66734 257/330 |
| 2017/0271442 A1* | 9/2017 | Uehara ............. H01L 29/0634 |
| 2021/0013310 A1 | 1/2021 | Leendertz et al. |
| 2023/0123112 A1* | 4/2023 | Chen ................. H01L 29/872 257/77 |

FOREIGN PATENT DOCUMENTS

| | | |
|---|---|---|
| JP | 2010-206096 A | 9/2010 |
| JP | 2011-176157 A | 9/2011 |

\* cited by examiner

METHOD OF MANUFACTURING SILICON CARBIDE SEMICONDUCTOR DEVICE

CROSS REFERENCE TO RELATED APPLICATION

This application is based on Japanese Patent Application No. 2021-185006 filed on Nov. 12, 2021, the disclosure of which is incorporated herein by reference.

TECHNICAL FIELD

The present disclosure relates to a method of manufacturing a silicon carbide (SiC) semiconductor device having a super junction (SJ) structure.

BACKGROUND

In order to enhance a breakdown voltage while reducing an on-resistance in a SiC semiconductor device, the silicon carbide semiconductor device may have an SJ structure in which an n-type column region and a p-type column region are alternatively and repetitively arranged.

SUMMARY

The present disclosure describes a method of manufacturing a silicon carbide semiconductor device that includes formation of a constituent layer made of silicon carbide and formation of a super junction structure.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
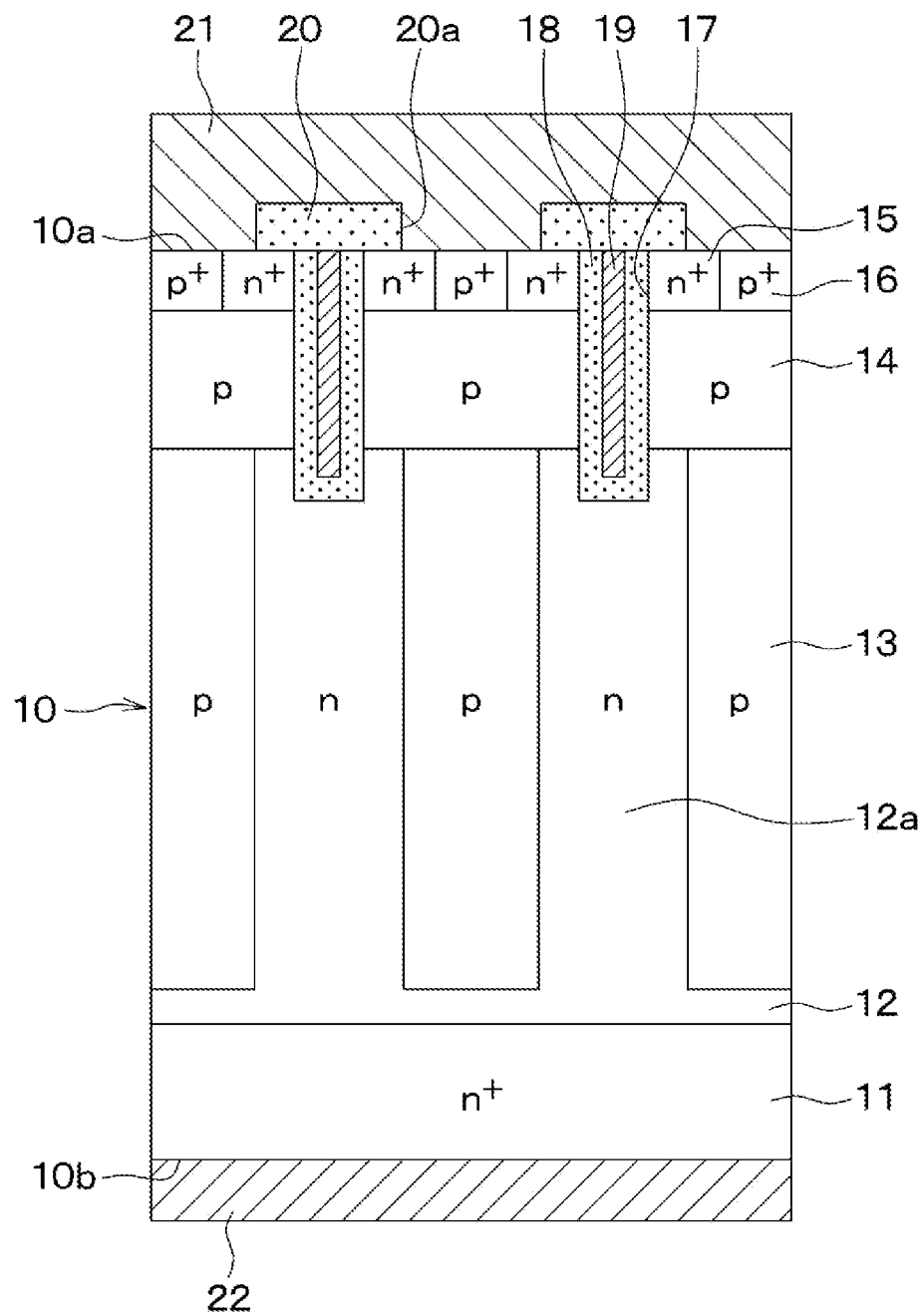
FIG. 1 is a cross-sectional view of a SiC semiconductor device according to a first embodiment.

In a SiC semiconductor device, an SJ structure may be arranged on a drain region. Subsequently, a base layer is formed on the SJ structure having an n-type column region and a p-type column region alternatively and repetitively aligned, and a source layer is formed at a surface layer portion of a base layer. In such a SiC semiconductor device, a trench is formed through the source layer and the base layer and reaches the n-type column region, and a gate insulation film and a gate electrode are formed in order at the trench to form a trench gate structure.

In such a SiC semiconductor device, for example, the respective widths of the p-type column region and the n-type column region are made to be equal and the respective concentrations of the p-type column region and the n-type column region are made to be equal, such that the respective total charge quantities of the n-type column region and the p-type column region are made to be equal.

In such a SiC semiconductor device, the respective widths of the p-type column region and the n-type column region are shortened to increase the impurity concentration, and the respective depths of the p-type column region and the n-type column region are enlarged. Therefore, it is possible to reduce the on-resistance and enhance the breakdown voltage.

In a method of manufacturing the SiC semiconductor, a growth of an n-type epitaxial film and formation of a portion included in the p-type column region at the epitaxial film through ion implantation may be repetitively performed at the time of forming the SJ structure. The n-type column region is formed with a portion different from a portion of the epitaxial film included in the p-type column region. Accordingly, since the growth of the epitaxial film and the ion implantation are alternately and repetitively performed, it is possible to manufacture the SiC semiconductor device in which the respective widths of the p-type column region and the n-type column region are shortened while the respective depths of the p-type column region and the n-type column region are enlarged.

However, in the above manufacturing method, since the growth of the epitaxial film and the ion implantation are alternatively and repetitively performed, a manufacturing process and a manufacturing time may increase, and the cost may also increase.

According to an aspect of the present disclosure, a method of manufacturing a silicon carbide semiconductor includes formation of a constituent layer and formation of a super junction structure. The constituent later is made of silicon carbide and is a first conductivity type. The super junction structure includes a second conductivity-type column region with multiple sections and a first conductivity-type column region. The second conductivity-type column region is formed by conducting ion implantation to the constituent layer. The second conductivity-type column region extends in a direction as a lengthwise direction of the second conductivity-type column region. The first conductivity-type column region is a portion of the constituent layer remained between adjacent two of the sections of the second conductivity-type column region. The second conductivity-type column region and the first conductivity-type column region are alternatively and repetitively aligned in a direction intersecting the lengthwise direction. The second conductivity-type column region is a second conductivity type, and the first conductivity-type column region is the first conductivity type. The formation of the super junction structure includes formation of a film-forming mask, formation of an opening portion at the film-forming mask, formation of a mask-forming trench at the constituent layer, formation of the second conductivity-type column region, and removal of a portion of the constituent layer. The opening portion is formed at the film-forming mask to form an opening at a prospective forming region of the constituent layer. The prospective forming region is a region in which the second conductivity-type column region is to be formed. The mask-forming trench is formed at the constituent layer through etching by adopting the film-forming mask, and a portion of the constituent layer surrounding the mask-forming trench is adopted as a silicon carbide mask. The silicon carbide mask has higher shielding rate of impurities than the film-forming mask. The second conductivity-type column region extends in in a depth direction of the constituent layer from a bottom surface of the mask-forming trench, and the second conductivity-type column region is formed while an implantation region is formed at the silicon carbide mask by conducting ion implantation of impurities and changing acceleration energy for the impurities by adopting an ion-implantation mask. The ion-implantation mask has the film-forming mask and the silicon carbide mask. The implantation region receives the impurities through the ion implantation, and the impurities are the second conductivity type. The portion of the constituent layer where the silicon carbide mask is formed is removed to adopt the portion of the constituent layer remained between the adjacent two of the sections of the second conductivity-type column region as the first conductivity-type column region. In the formation of the mask-forming trench, the implantation region is formed to have a depth terminated inside the silicon carbide mask at a time of forming the second conductivity-type column region.

Accordingly, the ion-implantation mask including the film-forming mask and the SiC mask is formed. Therefore, it is possible to shorten the width of the opening of the ion-implantation mask and enlarge the thickness of the ion-implantation mask. Since the SiC mask has a higher shielding rate of the impurities than the film-forming mask, it is possible to sufficiently use the SiC mask as the mask. By conducting the ion implantation while changing the acceleration energy, since it is possible to form the second conductivity-type column region with a shorter width and a larger depth, it is possible to form the first conductivity-type column region with a shorter width and a larger depth. In the manufacturing process, it is possible to form the first conductivity-type column region and the second conductivity-type column region respectively having shorter widths and larger depths, without alternately repeating the epitaxial film growth and the ion implantation. Therefore, it is possible to form the first conductivity-type column region and the second conductivity-type column region respectively having shorter widths and larger depths while reducing the manufacturing process and manufacturing time.

The following describes several embodiments of the present disclosure with reference to the drawings. In the following embodiments, the same or equivalent parts are denoted by the same reference numerals.

First Embodiment

A first embodiment will be described with reference to the drawings. First, the configuration of a SiC semiconductor device having an SJ junction in the present embodiment. The SiC semiconductor device acquired from a manufacturing method in the present embodiment may be adapted to a vehicle such as an automobile and applied as a device for driving various electronic devices for the vehicle. The present embodiment describes the SiC semiconductor device including an inverted metal oxide semiconductor field effect transistor (MOSFET) having a trench gate structure.

As illustrated in FIG. 1, the SiC semiconductor device in the present embodiment includes the semiconductor substrate 10. The SiC semiconductor device includes an $n^+$-type substrate 11 made of SiC. An n-type drift layer 12 made of an epitaxial film on the substrate 11. In the present embodiment, a drain region is included in the substrate 11.

At the drift layer 12, a p-type column region 13 is formed. The p-type column region 13 has multiple sections formed in a stripe shape in a direction as a lengthwise direction parallel to a surface direction of the substrate 11. In the present embodiment, the p-type column region 13 extends in a direction going away from the plane of the drawing. The p-type column region 13 is formed by ion implantation as described hereinafter. A portion of the drift layer 12 left between adjacent two sections of the p-type column region 13 is adopted as an n-type column region 12a. Therefore, the SJ structure in which the n-type column region 12a and the p-type column region 13 are alternatively and repetitively formed in the stripe shape on the substrate 11. In the following, each of the length of the n-type column region 12a and the length of the p-type column region 13 in the alignment direction is hereinafter referred to as a width. In FIG. 1, the length in the horizontal (left-right) direction of the drawing corresponds to the width.

A p-type base layer 14 is formed at the surface of each of the n-type column region 12a and the p-type column region 13. At the surface layer portion of the base layer 14, an $n^+$-type source region 15 and a $p^+$-type contact region 16 are formed. The $n^+$-type source region 15 has higher impurity concentration than the n-type column region 12a, and the $p^+$-type contact region 16 has higher impurity concentration than the base layer 14. The source region 15 is formed to be in contact with a side surface of a trench 17, and the contact region 16 is formed to be at a side opposed to the trench 17 to sandwich the source region 15.

In the present embodiment, as described above, the substrate 11, the drift layer 12, the n-type column region 12a, the p-type column region 13, the base layer 14, the source region 15 and the contact region 16 stack on the semiconductor substrate 10. In the following, the surface of the semiconductor substrate 10 at a side closer to the base layer 14 is referred to as a first surface 10a of the semiconductor substrate 10, and the surface of the semiconductor substrate 10 at a side closer to the substrate 11 is referred to as a second surface 10b of the semiconductor substrate 10.

Multiple trenches 17 are formed at the semiconductor substrate 10 so as to penetrate through the source region 15 and the base layer 14 to reach the n-type column region 12a from the first surface 10a side. The trenches 17 extend in the lengthwise direction of the p-type column region 13 and the n-type column region 12a, and are aligned to be equally spaced in the alignment direction of the p-type column region 13 and the n-type column region 12a.

On an inner wall surface of each of the trenches 17, a gate insulation film 18 is formed. On the gate insulation film 18, a gate electrode 19 made of doped polysilicon is formed. Accordingly, the trench gate structure is formed.

On the first surface 10a of the semiconductor substrate 10, an interlayer insulation film 20 made of borophosphosilicate glass (BPSG) or the like is formed to cover the trench-gate structure. A contact hole 20a for exposing a portion of the source region 15 and the contact region 16 is formed at the interlayer insulation film 20. An upper electrode 21 is formed above the interlayer insulation film 20. The upper electrode 21 is electrically connected to the source region 15 and the contact region 16 through the contact hole 20a. In the present embodiment, the upper electrode 21 corresponds to the first electrode.

The upper electrode 21 according to the present embodiment is made of multiple metals such as nickel (Ni)/ aluminum (Al). A portion of the multiple metals, which is in contact with a portion forming an n-type SiC (that is, the source region 15), is made of a metal capable of making ohmic contact with the n-type SiC. A portion of the multiple metals in contact with at least p-type SiC (in other words, the contact region 16) is made of metal capable of ohmic contact with the p-type SiC.

On the second surface 10b of the semiconductor substrate 10, a lower electrode 22 is formed. The lower electrode 22 is electrically connected to the substrate 11. In the present embodiment, the lower electrode 22 corresponds to the second electrode.

In the SiC semiconductor device according to the present embodiment, with such a structure, MOSFET of an n-channel type inverted trench gate structure is formed. In the present embodiment, n-type, n-type, and n$^+$-type correspond to the first type conductivity, and p-type and p$^+$-type correspond to the second type conductivity. In the present embodiment, the n-type column region 12a corresponds to the first-conductivity-type column region, and the p-type column region 13 corresponds to the second-conductivity-type column region.

In such a SiC semiconductor device, when the gate voltage applied to the gate electrode 19 is equal to or higher than the threshold voltage of the insulated gate structure, a current flows between the upper electrode 21 and the lower electrode 22 to enter an ON state. In such a SiC semiconductor device, when the gate voltage applied to the gate electrode 19 is lower than the threshold voltage of the insulated gate structure, a current does not flow between the upper electrode 21 and the lower electrode 22 to enter an OFF state.

Further, in such a SiC semiconductor device, the n-type column region 12a and the p-type column region 13 included in the SJ structure are formed so that the total amount of charge is equal. In the SiC semiconductor device according to the present embodiment, the p-type column region 13 is formed by ion implantation, as described in the following.

In this situation, it is possible for the SiC semiconductor to increase the impurity concentration of the p-type column region 13 by increasing the impurity concentration of the n-type column region 12a to reduce the on-resistance while ensuring a higher breakdown voltage. It is possible to increase the impurity concentration of the p-type column region 13 by narrowing the width of the p-type column region 13. In this situation, it is possible for the SiC semiconductor to increase the depth of the p-type column region 13 by increasing the depth of the n-type column region 12a to reduce the on-resistance while ensuring a higher breakdown voltage. Therefore, in the above-described SiC semiconductor device, it is possible to increase the depth of the p-type column region 13 while shortening the width of the p-type column region 13 formed by the ion implantation.

The following describes a method of manufacturing the SiC semiconductor device with reference to FIGS. 2A to 2G. Although each of FIGS. 2A to 2G illustrates only one section of the p-type column region 13, multiple sections of the p-type column region 13 are simultaneously formed with the ion implantation.

Figure 2A:
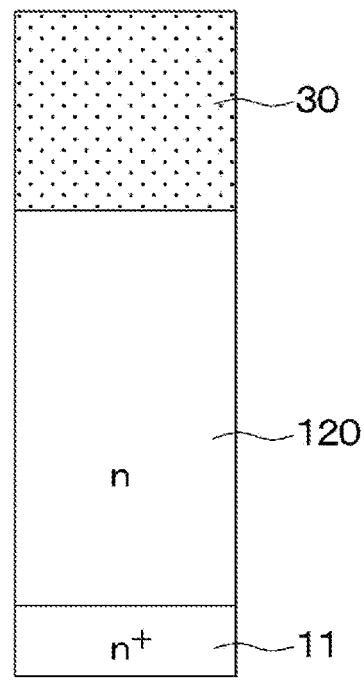
FIG. 2A is a sectional view illustrating a manufacturing process of the SIC semiconductor device in the first embodiment.

As illustrated in FIG. 2A, an n-type constituent layer 120 included in the drift layer 12 is epitaxially grown on the substrate 11, and a film-forming mask 30 is formed on the constituent layer 120 by, for example, Chemical Vapor Deposition (CVD). The film-forming mask 30 is adopted for film formation and is made of, for example, silicon oxide (SiO$_2$), in other words, oxide film.

Figure 2B:
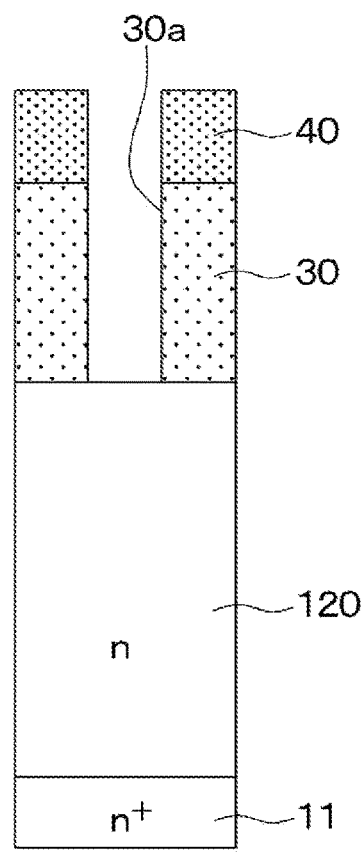
FIG. 2B is a cross-sectional view showing a manufacturing process of the SiC semiconductor device continued from FIG. 2A.
Figure 2C:
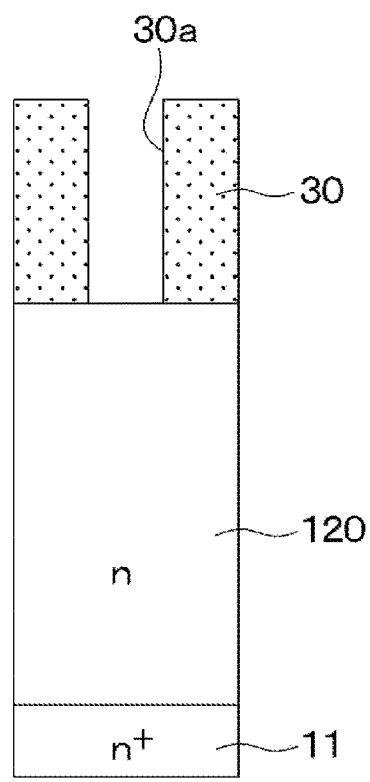
FIG. 2C is a cross-sectional view showing a manufacturing process of the SiC semiconductor device continued from FIG. 2B.

As illustrated in FIG. 2B, a resist 40 is arranged on the film-forming mask 30. Then, photolithography and etching are performed to form an opening portion 30a at the film-forming mask 30 so that a prospective forming region of the constituent layer 120 is opened. The prospective forming region is a region where the p-type column region 13 is formed. As illustrated in FIG. 2C, the resist 40 is removed by, for example, ashing.

In a process illustrated in FIG. 2E described hereinafter, the film-forming mask 30 shields p-type impurities when the p-type impurities are injected by ion implantation to form the p-type column region 13. It may be preferable that the p-type column region 13 has a shorter width and a larger depth as described above. In a case where the p-type column region 13 is formed deeper by the ion implantation, it is required to enlarge the thickness of the film-forming mask 30 in order to increase the acceleration energy during the ion implantation. For this reason, the film-forming mask 30 may be preferably patterned so that the width of the opening portion 30a is shortened while increasing the thickness. However, when the aspect ratio of the thickness of the film-forming mask 30 to the width of the opening portion 30a is taken into account, it may be difficult to pattern the film-forming mask 30 for the aspect ratio being equal to or larger than a predetermined value due to processing limits of photolithography and etching. Therefore, when an attempt is made to form the p-type column region 13 with a larger width and a shorter width by the ion implantation by using only the film-forming mask 30, it is possible that the p-type impurities are injected to the constituent layer 120 (in other words, a portion where the n-type column region 12a is formed) located below the film-forming mask 30. In other words, it may be difficult to form the p-type column region 13 with a larger depth, in a case where the p-type column region 13 with a shorter width is formed by the ion implantation by using only the film-forming mask 30.

Figure 3A:
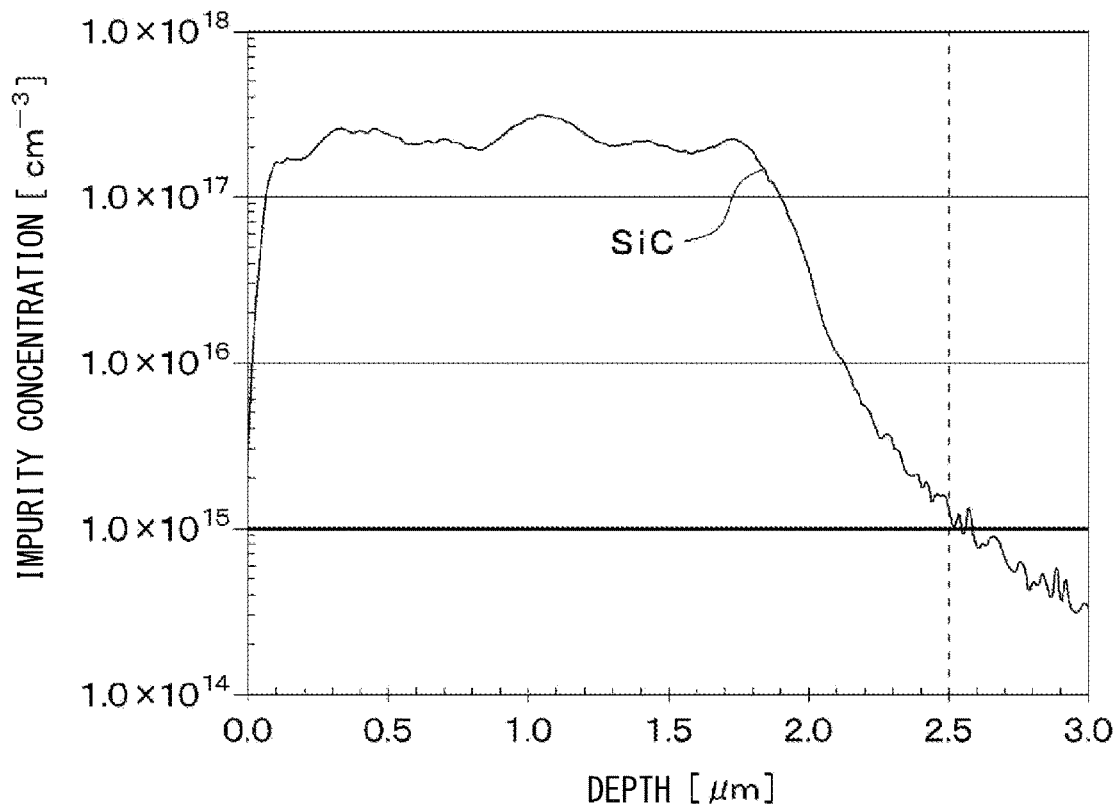
FIG. 3A is a diagram showing the relationship between depth and impurity concentration when ions are implanted into SiC.
Figure 3B:
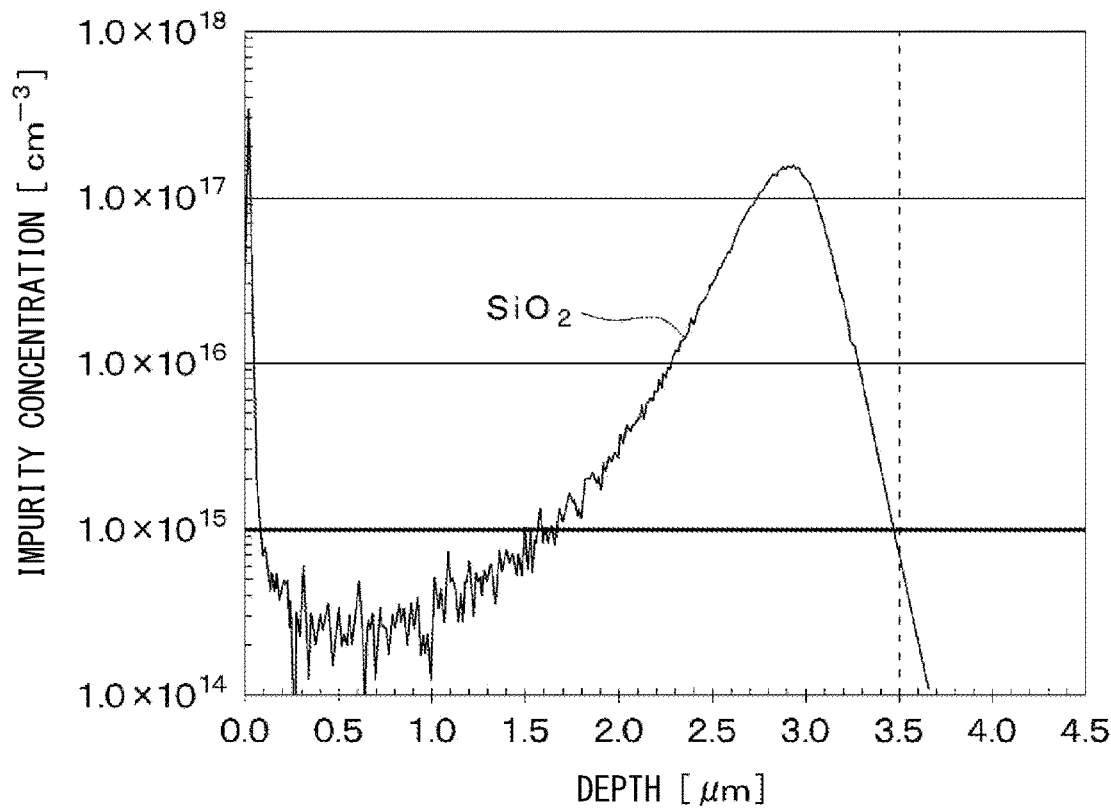
FIG. 3B is a diagram showing the relationship between depth and impurity concentration when ions are implanted into silicon oxide ($SiO_2$)

Therefore, the inventor in the present application had made studies and acquired the following results. The inventor studied the shielding rate of the p-type impurities of SiO$_2$ and SiC and obtained the results as illustrated in FIGS. 3A, 3B. FIG. 3A illustrates a concentration profile when the p-type impurities are injected through the ion implantation to SiC while changing the acceleration energy. FIG. 3B illustrates a concentration profile when the p-type impurities are injected through ion implantation to SiO$_2$ when the ion implantation is performed with the maximum acceleration energy in FIG. 3A.

As illustrated in FIGS. 3A, 3B, when the p-type impurities are injected through the ion implantation, it is confirmed that the p-type impurities are injected only to a shallower portion in SiC as compared with $SiO_2$. In other words, it is confirmed that SiC has higher shielding rate of the p-type impurities than the $SiO_2$. Therefore, the inventor found the utility of a portion of SiC as a mask.

Figure 2D:
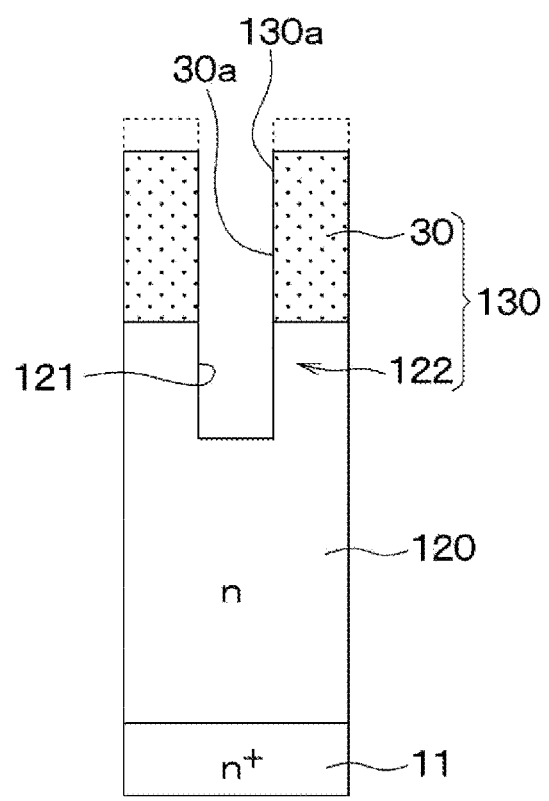
FIG. 2D is a cross-sectional view showing a manufacturing process of the SiC semiconductor device continued from FIG. 2C.

In the present embodiment, as illustrated in FIG. 2D, dry etching such as reactive ion etching (RIE) with the film-forming mask 30 is performed and a mask-forming trench 121 is formed at the constituent layer 120. A portion of the constituent layer 120 surrounding the mask-forming trench 121 is a silicon carbide (SiC) mask 122. In other words, the portion of the constituent layer 120 located at a depth identical to the mask-forming trench 121 is the SiC mask 122. An ion-implantation mask 130 including the film-forming mask 30 and the SiC mask 122 is formed. Accordingly, the width of an opening portion 130a of the ion-implantation mask 130 can be set to the width of the opening portion 30a of the film-forming mask 30, and the thickness of the ion-implantation mask 130 can be made larger. Therefore, the thickness relative to the width of the opening portion 130a of the ion-implantation mask 130 can be made larger. In other words, it is possible to form the ion-implantation mask 130 with the larger aspect ratio.

The dry-etching for forming the mask-forming trench 121 is performed based on a condition that the selectivity of SiC is larger than the selectivity of $SiO_2$. For example, the selectivity ratio of SiC to $SiO_2$ is about 5 to 1. In addition, the surface of the film-forming mask 30 on the side opposite from the drift layer 12 is slightly shaved by forming the mask-forming trench 121.

Figure 2E:
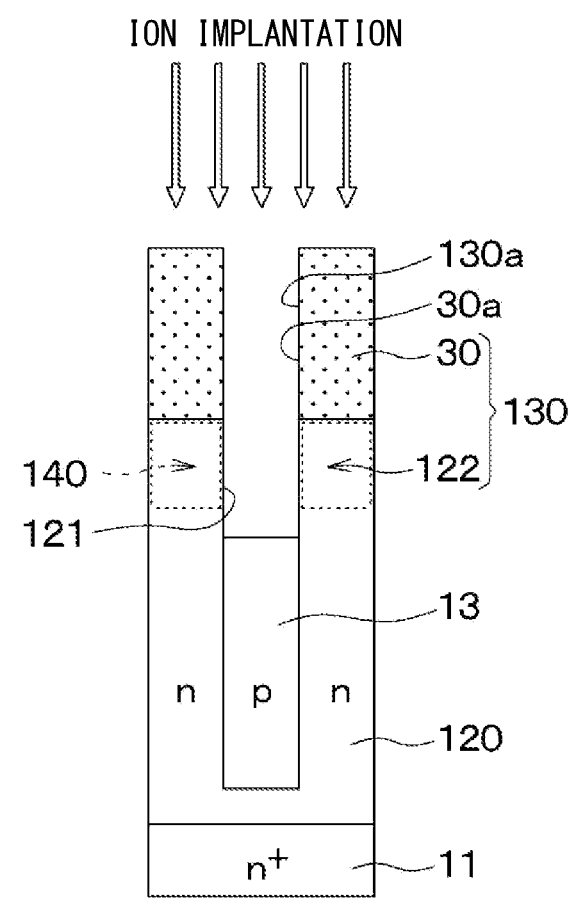
FIG. 2E is a cross-sectional view showing a manufacturing process of the SiC semiconductor device continued from FIG. 2D.

As illustrated in FIG. 2E, the film-forming mask 30 and the SiC mask 122 are included in the ion-implantation mask 130, and the p-type column region 13 is formed at the constituent layer 120. The p-type column region 13 extends in the depth direction of the constituent layer 120 from the bottom surface of the mask-forming trench 121. When the p-type column region 13 is formed, a high-voltage implantation apparatus is used to inject the p-type impurities such as aluminum (Al) through ion implantation while changing the acceleration energy. At this time, by conducting the ion implantation with higher acceleration energy, it is possible to inject the p-type impurities to a deeper position and enlarge the depth of the p-type column region 13. However, when the ion implantation is performed with higher acceleration energy, an implantation region 140 is formed at the SiC mask 122. The implantation region 140 is a region to which the p-type impurities are injected. Therefore, the depth of the mask-forming trench 121 (that is, the SiC mask 122) is adjusted such that the implantation region 140 is terminated in the SiC mask 122 based on the depth of the p-type column region 13 to be formed. However, the mask-forming trench 121 may also be formed such that the thickness of the SiC mask 122 is smaller than the thickness of the film-forming mask 30.

Figure 2F:
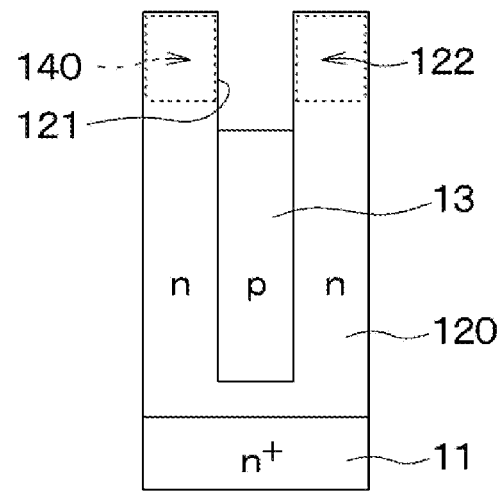
FIG. 2F is a cross-sectional view showing a manufacturing process of the SiC semiconductor device continued from FIG. 2E.
Figure 2G:
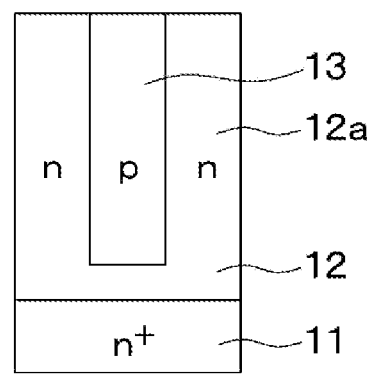
FIG. 2G is a cross-sectional view showing a manufacturing process of the SiC semiconductor device continued from FIG. 2F.

As illustrated in FIG. 2F, the film-forming mask 30 is removed by, for example, etching. As illustrated in FIG. 2G, the constituent layer 120 is removed up to the depth identical to the mask-forming trench 121 by, for example, chemical mechanical polishing (CMP). That is, the portion of the constituent layer 120 in which the SiC mask 122 is formed is removed. Therefore, the SJ structure having the p-type column region 13 and the n-type column region 12a sandwiched by the p-type column region 13 is formed.

Thereafter, though illustration is omitted, a semiconductor manufacturing process is performed to form, for example, the base layer 14, the source region 15, the trench gate structure, the upper electrode 21, and the lower electrode 22, and the SiC semiconductor device illustrated in FIG. 1 is thereby manufactured.

According to the present embodiment, the ion-implantation mask 130 including the film-forming mask 30 and the SiC mask 122 is formed. Therefore, it is possible to shorten the width of the opening portion 130a of the ion-implantation mask 130 and enlarge the thickness of the ion-implantation mask 130. Since the SiC mask 122 has a higher shielding rate of the impurities than the film-forming mask 30, it is possible to sufficiently use the SiC mask 122 as the mask. In the present embodiment, after the formation of the constituent layer 120, since it is possible to form the p-type column region 13 with a shorter width and a larger depth through the ion implantation in a process while changing the acceleration energy, it is possible to form the n-type column region 12a with a shorter width and a larger depth. In the present embodiment, it is possible to form the first conductivity-type column region and the second conductivity-type column region respectively having short widths and large depths, without alternately repeating the epitaxial film growth and the ion implantation. Therefore, it is possible to form the n-type column region 12a and the p-type column region 13 respectively having short widths and large depths while reducing the manufacturing process and manufacturing time.

In the present embodiment, the thickness of the SiC mask 122 is smaller than the thickness of the film-forming mask 30. Therefore, it is possible to reduce the amount of SiC when removing the SiC mask 122, and further reduce the cost.

Second Embodiment

The following describes a second embodiment. In contrast to the first embodiment, an adjustment mask is formed after the formation of the mask-forming trench 121 in the present embodiment. The other configurations are the same as those of the first embodiment, and therefore a description of the same configurations will be omitted below.

Figure 4A:
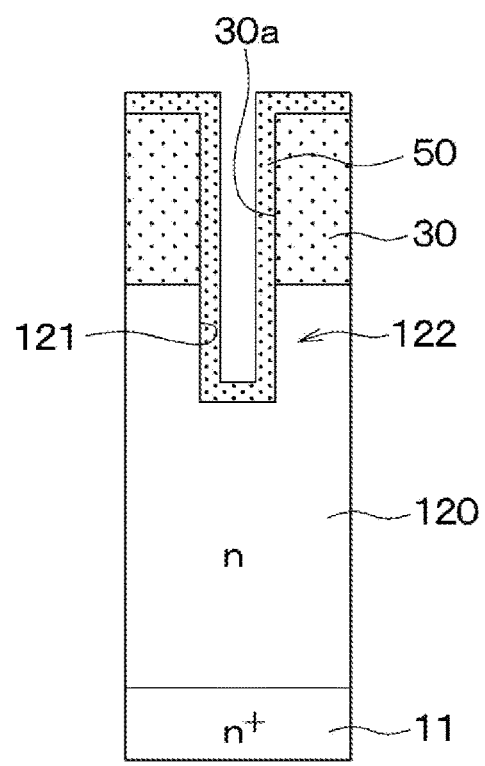
FIG. 4A is a cross-sectional view illustrating a manufacturing process for the SIC semiconductor device in a second embodiment.

In the present embodiment, after the formation of the mask-forming trench 121 by conducting the process in FIG. 2D, an adjustment mask 50 is formed at the side surface of the film-forming mask 30 at the opening portion 30a and the side surface of the mask-forming trench 121 by, for example, atomic layer deposition (ALD) as illustrated in FIG. 4A. The adjustment mask 50 is formed so as not to fill the opening portion 30a and the mask-forming trench 121. The adjustment mask 50 is formed also at the surface of the film-forming mask 30 on a side opposite from the constituent layer 120.

Figure 4B:
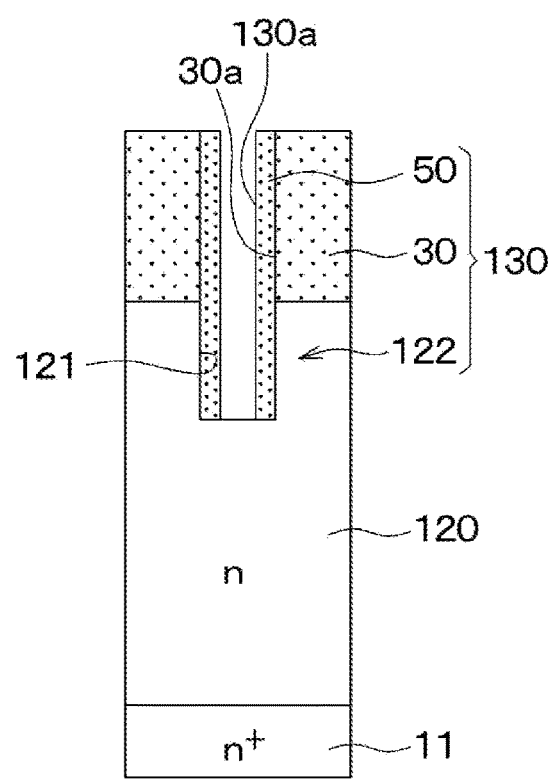
FIG. 4B is a cross-sectional view showing a manufacturing process of the SiC semiconductor device continued from FIG. 4A.

As illustrated in FIG. 4B, the adjustment mask 50 formed at the bottom surface of the mask-forming trench 121 is removed by, for example, etching, and the ion-implantation mask 130 including the film-forming mask 30, the SiC mask 122 and the adjustment mask 50 is formed. Therefore, the ion-implantation mask 130 having the opening portion 130a with a shorter width than the one in the first embodiment. When a portion of the adjustment mask 50 formed at the bottom surface of the mask-forming trench 121 is removed, another portion of the adjustment mask 50 on the surface on a side opposite from the constituent layer 120 is also removed.

Figure 4C:
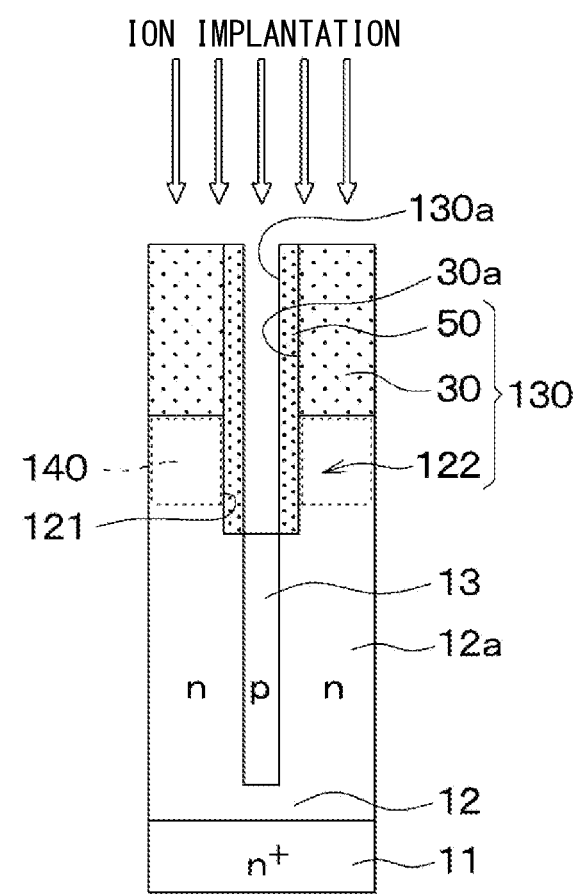
FIG. 4C is a cross-sectional view showing a manufacturing process of the SiC semiconductor device continued from FIG. 4B.

As illustrated in FIG. 4C, the identical process as in FIG. 2E is performed to perform the ion implantation to form the p-type column region 13. In the present embodiment, since the width of the opening portion 130a of the ion-implantation mask 130 is shorter than the one in the first embodiment, the p-type column region 13 having a shorter width than the one in the first embodiment is formed. The present embodiment illustrates that only the width of the p-type column region 13 is shortened to facilitate understanding the comparison with the first embodiment. In fact, when the width of the p-type column region 13 is shortened, the width of the n-type column region 12a is also adjusted.

Subsequently, although not shown, the identical process subsequent to FIG. 2F is performed to manufacture the SiC semiconductor device having the p-type column region 13 with a shorter width.

According to the present embodiment as described above, since the ion-implantation mask 130 including the film-forming mask 30 and the SiC mask 122 is formed, the advantageous effect identical to the one in the first embodiment can also be attained.

In the present embodiment, the ion-implantation mask 130 including the adjustment mask 50 is formed, and it is possible to shorten the width of the opening portion 130a of the ion-implantation mask 130. Therefore, it is possible to form the p-type column region 13 with a further shortened width.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, the MOSFET with the n-channel type trench gate structure in which the first conductivity type is n-type and the second conductivity type is p-type has been described as an example of the SiC semiconductor device. The MOSFET is formed. However, this is merely an example, and a semiconductor switching element of another structure, for example, a MOSFET of a trench gate structure of a p channel type in which the conductivity type of each component is inverted with respect to the n-channel type may also be used for the SiC semiconductor device. The MOSFET may have a planar trench structure instead of the trench-gate structure. Other than the MOSFET, the SiC semiconductor device may be formed with an IGBT with a similar structure. In the case of IGBT, the n$^+$-type substrate 11 in each of the embodiments is modified to the p$^+$-type collector layer. Other than that, IGBT is similar to the MOSFET as described in each of the embodiments. As long as the SiC semiconductor device in each of the above embodiments has the SJ structure, other parts of the SiC semiconductor device is not particularly limited.

In the first embodiment, a p-type constituent layer 120 may also be arranged in the process in FIG. 2A, and the n-type impurities may be injected through the ion implantation to form the n-type column region 12a in the process in FIG. 2E. Similarly, in the second embodiment, the p-type constituent layer 120 may be arranged in the process and the n-type impurities may be injected through the ion implantation to form the n-type column region 12a in the process in FIG. 4C. Although not shown, SiC has a higher impurity shielding rate than SiO$_2$ even when n-type impurities are injected through the ion implantation.

In each of the above embodiments, the mask-forming trench 121 may be formed such that the SiC mask 122 has a larger thickness than the film-forming mask 30. Since the SiC mask 122 has a higher shielding rate of the impurities than the film-forming mask 30, it is possible to further inhibit the implantation region 140 from reaching the n-type column region 12a.

What is claimed is:

1. A method of manufacturing a silicon carbide semiconductor, the method comprising:

forming a constituent layer made of silicon carbide, the constituent layer being a first conductivity type; and forming a super junction structure including a second conductivity-type column region with a plurality of sections and a first conductivity-type column region, the second conductivity-type column region formed by conducting ion implantation to the constituent layer, the second conductivity-type column region extending in a direction as a lengthwise direction of the second conductivity-type column region, the first conductivity-type column region being a portion of the constituent layer remained between adjacent two of the sections of the second conductivity-type column region, the second conductivity-type column region and the first conductivity-type column region being alternatively and repetitively aligned in a direction intersecting the lengthwise direction, the second conductivity-type column region being a second conductivity type, the first conductivity-type column region being the first conductivity type, wherein the forming of the super junction structure includes:

forming a film-forming mask on the constituent layer;

forming an opening portion at the film-forming mask to form an opening at a prospective forming region of the constituent layer, the prospective forming region being a region in which the second conductivity-type column region is to be formed;

forming a mask-forming trench at the constituent layer through etching by adopting the film-forming mask, and adopting a portion of the constituent layer surrounding the mask-forming trench as a silicon carbide mask having higher shielding rate of impurities than the film-forming mask;

forming the second conductivity-type column region extending in a depth direction of the constituent layer from a bottom surface of the mask-forming trench while forming an implantation region at the silicon carbide mask by conducting ion implantation of impurities and changing acceleration energy for the impurities by adopting an ion-implantation mask having the film-forming mask and the silicon carbide mask, the implantation region receiving the impurities through the ion implantation, the impurities being the second conductivity type; and removing a portion of the constituent layer where the silicon carbide mask is formed to adopt the portion of the constituent layer remained between the adjacent two of the sections of the second conductivity-type column region as the first conductivity-type column region, wherein, in the forming of the mask-forming trench, the implantation region is formed to have a depth terminated inside the silicon carbide mask at a time of forming the second conductivity-type column region.

2. The method according to claim 1, further comprising:
forming an adjustment mask along a side surface of the film-forming mask at the opening portion and a side surface of the mask-forming trench, subsequent to the forming of the mask-forming trench; and
removing the adjustment mask arranged at a bottom surface of the mask-forming trench,
wherein, in the forming of the second conductivity-type column region, the ion implantation is conducted by adopting the ion-implantation mask having the film-forming mask, the silicon carbide mask and the adjustment mask.

3. The method according to claim 1,
wherein, in the forming of the mask-forming trench, the silicon carbide mask is formed to have a smaller thickness than the film-forming mask.

* * * * *